United States Patent
Zheng

(10) Patent No.: US 10,885,826 B2
(45) Date of Patent: Jan. 5, 2021

(54) SHIFT REGISTER, GATE DRIVING CIRCUIT, AND DISPLAY DEVICE

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/610,282

(22) PCT Filed: Oct. 30, 2018

(86) PCT No.: PCT/CN2018/112575
§ 371 (c)(1),
(2) Date: Nov. 1, 2019

(87) PCT Pub. No.: WO2019/161676
PCT Pub. Date: Aug. 29, 2019

(65) Prior Publication Data
US 2020/0143730 A1     May 7, 2020

(30) Foreign Application Priority Data
Feb. 24, 2018  (CN) .......................... 2018 1 0164919

(51) Int. Cl.
*G09G 3/20*     (2006.01)
*G11C 19/28*   (2006.01)

(52) U.S. Cl.
CPC ............. *G09G 3/20* (2013.01); *G11C 19/28* (2013.01); *G09G 2300/0408* (2013.01); *G09G 2310/0286* (2013.01)

(58) Field of Classification Search
CPC combination set(s) only.
See application file for complete search history.

(56) References Cited

U.S. PATENT DOCUMENTS

| 9,418,755 B2 | 8/2016 | So et al. |
| 9,589,523 B2 | 3/2017 | Xiao |

(Continued)

FOREIGN PATENT DOCUMENTS

| CN | 103854585 A | 6/2014 |
| CN | 104795034 A | 7/2015 |

(Continued)

OTHER PUBLICATIONS

Office Action, including Search Report, for Chinese Patent Application No. 201810164919.2, dated Aug. 20, 2020, 13 pages.

*Primary Examiner* — Robin J Mishler
(74) *Attorney, Agent, or Firm* — Westman, Champlin & Koehler, P.A.

(57) ABSTRACT

The present disclosure relates to a shift register, a gate driving circuit and a display device. The shift register includes an input circuit, a pull-up circuit, a pull-down circuit, and a pulse width control circuit. The input circuit is electrically coupled to a first control terminal, and is configured to receive a trigger signal, and control the pull-down circuit to output a second level signal to an output terminal based on the trigger signal under control of a first control signal at the first control terminal. The pulse width control circuit is configured to control the pull-up circuit to output a first level signal to the output terminal under control of the first control signal and a second control signal CK2 at a second control terminal, wherein a pulse width of the first level signal varies with a pulse width of the trigger signal, wherein when the pull-up circuit is controlled to output the first level signal, the pull-down circuit is controlled to stop outputting the second level signal, and when the pull-down circuit is controlled to output the second level signal, the pull-up circuit is controlled to stop outputting the first level signal.

11 Claims, 4 Drawing Sheets

(56) References Cited

U.S. PATENT DOCUMENTS

| | | |
|---|---|---|
| 10,192,504 B2 | 1/2019 | Han et al. |
| 2014/0152629 A1 | 6/2014 | So et al. |
| 2016/0307535 A1 | 10/2016 | Xiao |
| 2017/0200419 A1* | 7/2017 | Ma .................. G09G 3/3266 |
| 2017/0270879 A1 | 9/2017 | Han et al. |
| 2018/0082623 A1* | 3/2018 | Wang .................. G11C 19/184 |

FOREIGN PATENT DOCUMENTS

| | | |
|---|---|---|
| CN | 105206243 A | 12/2015 |
| CN | 105609041 A | 5/2016 |
| KR | 20030072701 A | 9/2003 |

* cited by examiner

SHIFT REGISTER, GATE DRIVING CIRCUIT, AND DISPLAY DEVICE

CROSS-REFERENCE TO RELATED APPLICATION(S)

This application corresponds to a PCT application PCT/CN2018/112575, filed on 30 Oct. 2018, which published as WO 2019/161676 on Aug. 29, 2019, and claims priority to the Chinese Patent Application No. 201810164919.2, filed on Feb. 24, 2018, the contents of which are incorporated herein by reference.

TECHNICAL FIELD

The present disclosure relates to the field of display technology, and more particularly, to a shift register, a gate driving circuit, and a display device.

BACKGROUND

In the display field, in order to continuously improve a display screen and enhance user experience, display with high definition, a high Pixels Per Inch (PPI), and a narrow bezel has become popular research. However, as a number of pixels increases, a number of rows required to be scanned by a shift register during one frame increases, which requires a smaller layout area and a simpler circuit structure of a single stage of Gate driver On Array (GOA). Therefore, how to design a GOA circuit with a simple structure is an urgent problem to be solved.

Among GOA circuits (also known as gate driving circuits), there are a type of GOA circuits which are used to control a duration in which a pixel emits light. Such GOA circuits are called EMGOA circuits, which are usually implemented by using a shift register as a GOA unit circuit, wherein a width of a pulse output by the shift register determines a duration in which a pixel emits light. However, the shift register circuit has a relatively complicated structure, which results in a large layout area of a single stage of GOA, thus being disadvantageous for display with a narrow bezel.

SUMMARY

According to an aspect of the embodiments of the present disclosure, there is provided a shift register, comprising: an input circuit, a pull-up circuit, a pull-down circuit, and a pulse width control circuit. The input circuit is electrically coupled to a first control terminal, and is configured to receive a trigger signal, and control a pull-down circuit to output a second level signal to an output terminal based on the trigger signal under control of a first control signal at the first control terminal. The pulse width control circuit is electrically coupled to the first control terminal and a second control terminal, and is configured to control the pull-up circuit to output a first level signal to the output terminal under control of the first control signal and a second control signal at the second control terminal, wherein a pulse width of the first level signal varies with a pulse width of the trigger signal, wherein the shift register is configured to, when the pull-up circuit is controlled to output the first level signal, the pull-down circuit is controlled to stop outputting the second level signal, and when the pull-down circuit is controlled to output the second level signal, the pull-up circuit is controlled to stop outputting the first level signal.

In an example, the input circuit and the pulse width control circuit are electrically coupled to a first node, and the pulse width control circuit and the pull-up circuit are coupled to a second node, wherein the input circuit is further configured to control a potential at the first node based on the trigger signal under control of the first control signal, and the pulse width control circuit is further configured to: control the pull-up circuit to output the first level signal by controlling a potential at the second node using the potential at the first node under control of the first control signal and the second control signal, and control the pull-down circuit by the potential at the first node to stop outputting the second level signal when the pull-up circuit is controlled by the potential at the second node to output the first level signal.

In an example, the pulse width control circuit is further configured to, when the pull-up circuit outputs the first level signal to the output terminal, maintain the potential at the second node to be a potential which enables the pull-up circuit to output the first level signal to the output terminal under control of the first control signal and the second control signal.

In an example, the input circuit comprises a first transistor having a gate electrically coupled to receive the first control signal, a first electrode electrically coupled to receive the trigger signal, and a second electrode electrically coupled to the first node.

In an example, the pulse width control circuit comprises a second transistor, a third transistor, a fourth transistor, and a fifth transistor. The second transistor has a gate electrically coupled to the first node, a first electrode electrically coupled to the second node, and a second electrode electrically coupled to a first reference potential terminal. The third transistor has a gate electrically coupled to the first control terminal, and a first electrode electrically coupled to a second reference potential terminal. The fourth transistor has a gate electrically coupled to a second electrode of the third transistor, and a first electrode electrically coupled to the second reference potential terminal. The fifth transistor has a gate electrically coupled to the second control terminal, a first electrode electrically coupled to a second electrode of the fourth transistor, and a second electrode electrically coupled to the first electrode of the second transistor. The first reference potential and the second reference potential are opposite in phase with each other.

In an example, the pulse width control circuit further comprises a sixth transistor and a first capacitor. The sixth transistor has a gate electrically coupled to the first node, a first electrode electrically coupled to the first control terminal, and a second electrode electrically coupled to the gate of the fourth transistor. The first capacitor has a first terminal electrically coupled to the second control terminal, and a second terminal coupled to the gate of the fourth transistor.

In an example, the pull-down circuit comprises a seventh transistor. The seventh transistor has a gate electrically coupled to the first node, a first electrode electrically coupled to a second reference potential terminal, and a second electrode electrically coupled to the output terminal.

In an example, the pull-up circuit comprises an eighth transistor. The eighth transistor has a gate electrically coupled to the second node, a first electrode electrically coupled to a first reference potential terminal, and a second electrode electrically coupled to the output terminal.

In an example, the pull-down circuit further comprises a ninth transistor and a second capacitor C2. The ninth transistor has a gate electrically coupled to the first node, a first electrode electrically coupled to the second control terminal, and a second electrode electrically coupled to a first terminal of the second capacitor. A second terminal of the second capacitor is electrically coupled to the first node.

In an example, the pull-up circuit further comprises a third capacitor. The third capacitor has a first terminal electrically coupled to the first reference potential terminal, and a second terminal electrically coupled to the gate of the eighth transistor.

According to another aspect of the embodiments of the present disclosure, there is provided a gate driving circuit comprising any shift register described above.

According to yet another aspect of the embodiments of the present disclosure, there is provided a display device comprising any gate driving circuit described above.

BRIEF DESCRIPTION OF THE ACCOMPANYING DRAWINGS

The above and other aspects of the present disclosure will now be described in more detail with reference to the accompanying drawings, which illustrate the embodiments of the present disclosure.

DETAILED DESCRIPTION

Various solutions and features of the present disclosure are described herein with reference to the accompanying drawings. These and other features of the present disclosure will become apparent from the following description of an alternative form of embodiments given as non-limiting examples with reference to the accompanying drawings. The specification may use phrases "in one embodiment", "in another embodiment", "in yet another embodiment" or "in other embodiments", which may all refer to one or more of the same or different embodiments according to the present disclosure. It is to be illustrated that, the same reference signs are used throughout specification to refer to the same or similar elements, and unnecessary repeated description is omitted. In addition, in the specific embodiments, elements which appear in a singular form do not exclude a condition of appearing in a multiple (plural) form.

The transistors used in the embodiments of the present disclosure may comprise switch transistors depending on their functions. The switch transistors may be thin film transistors or field effect transistors or other devices having the same characteristics. In an example of the present disclosure, P-type driving transistors are used.

Since a source and a drain of a switch transistor used in the embodiments of the present disclosure are symmetrical, the source and the drain thereof may be interchanged. In the embodiments of the present disclosure, a gate may be referred to as a control electrode, one of a source and a drain may be referred to as a first electrode, and the other of the source and the drain may be referred to as a second electrode, depending on their functions. In the following examples, description is made by taking the switch transistors being N-type thin film transistors as an example. It may be understood by those skilled in the art that the embodiments of the present disclosure may obviously be applied to a case where the switch transistors are P-type thin film transistors.

In addition, in the description of the embodiments of the present disclosure, the terms "first reference potential" or "first level" and "second reference potential" or "second level" are only used to distinguish magnitudes of the two potentials or levels from each other. For example, description is made below by taking the "first reference potential" or "first level" being a relatively high level and the "second reference potential" or "second level" being a relatively low level. It may be understood by those skilled in the art that the present disclosure is not limited thereto.

Figure 1:
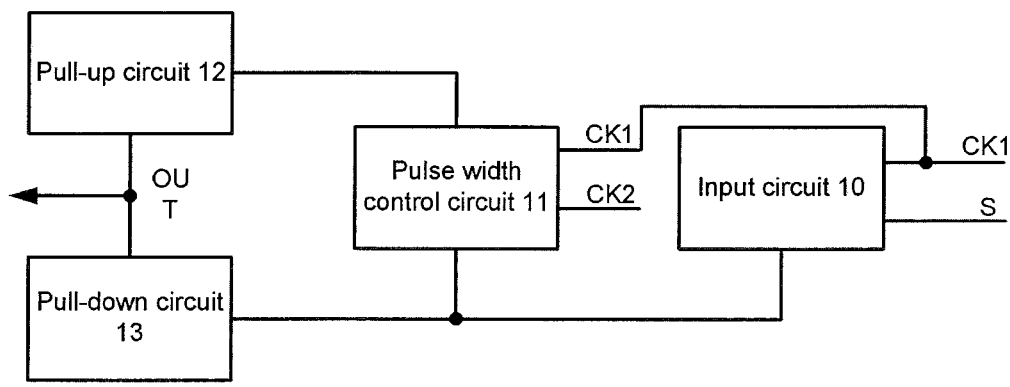
FIG. 1 is a schematic structural diagram of a shift register according to an embodiment of the present disclosure.

FIG. 1 is a schematic structural diagram of a shift register according to an embodiment of the present disclosure. As shown in FIG. 1, the shift register comprises an input circuit 10, a pull-up circuit 12, a pull-down circuit 13, and a pulse width control circuit 11. The input circuit 10 is coupled to the pull-down circuit 13 and the pulse width control circuit 11 respectively. The pulse width control circuit 11 is also coupled to, for example, an input terminal of the pull-up circuit 12, in addition to the pulse width control circuit 11 being coupled to the input circuit 10.

The input circuit 10 comprises a trigger signal receiving terminal for receiving a trigger signal S, and is configured to control the pull-down circuit 13 to output a second level signal to the output terminal OUT based on a potential of the trigger signal S under control of a first control signal CK1 at a first control terminal. For example, description is made below by taking the second level signal being a low level signal as an example.

The pulse width control circuit 11 is configured to control the pull-up circuit 12 to output a high level signal to the output terminal OUT under control of the first control signal CK1 and a second control signal CK2 at a second control terminal, wherein a pulse width of the output first level signal (for example, a high level signal) varies with that of the trigger signal S received by the input circuit 10. Herein, a pulse width (i.e., a width of a pulse) of a signal refers to a duration in which the signal is maintained at an active level.

In the shift register circuit, the pull-down circuit 13 is controlled to stop outputting the low level signal when the pull-up circuit 12 is controlled to output the high level signal. Further, the pull-up circuit 12 is controlled to stop outputting the high level signal when the pull-down circuit 13 is controlled to output the low level signal.

Thereby, a shift register which outputs a signal with a variable (adjustable) pulse width is realized in a simple manner. Since the shift register according to the embodiment of the present disclosure has a simpler structure, a single stage of GOA may have a smaller layout area, which facilitates display with a narrow bezel.

Figure 2:
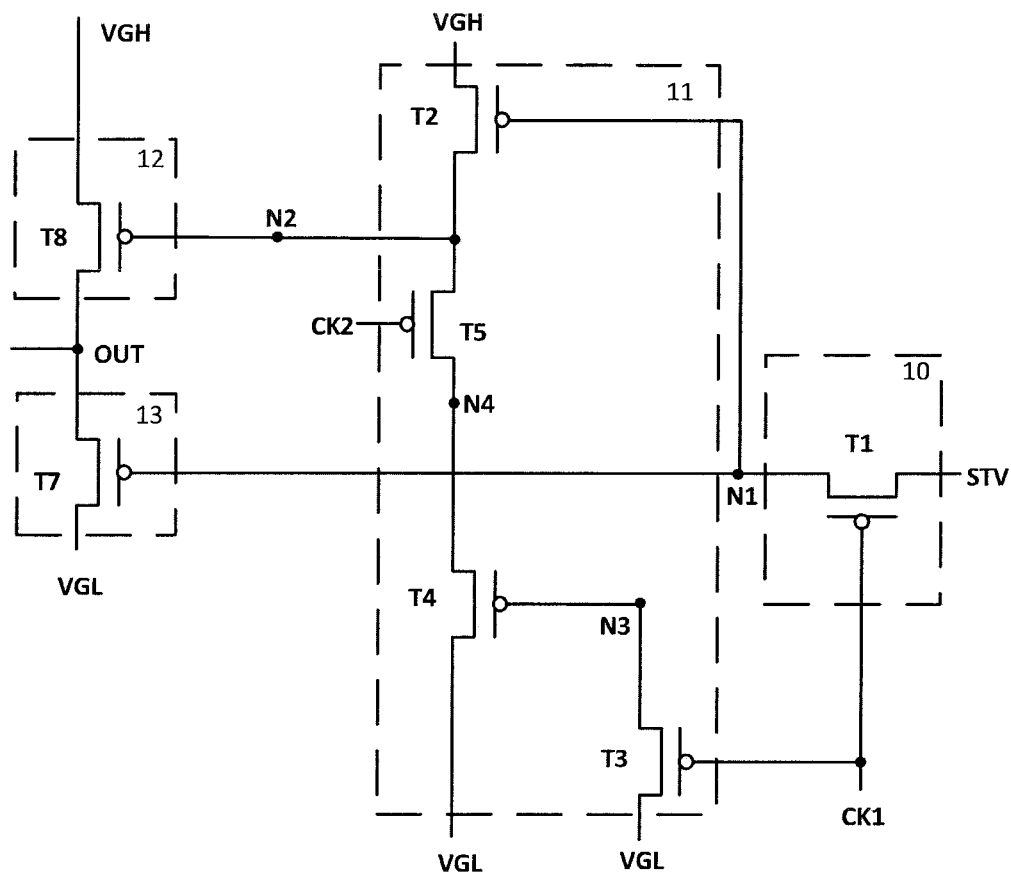
FIG. 2 is a circuit diagram of a shift register according to an embodiment of the present disclosure.

FIG. 2 is a circuit diagram of a shift register according to an embodiment of the present disclosure.

The input circuit 10 receives the trigger signal STV via the trigger signal receiving terminal, and the output terminal of the input circuit 10 is coupled to a first node N1. The input circuit 10 is configured to control a potential at the first node N1 based on the potential of the trigger signal STV under control of the first control signal CK1. The first node N1 is coupled to the output terminal of the input circuit 10 and the input terminal of the pull-down circuit 13. The pull-down circuit 13 may output the low level signal to the output terminal OUT based on the potential at the first node N1.

The input terminal of the pulse width control circuit 11 is coupled to the first node N1, and the output terminal of the pulse width control circuit 11 is coupled to a second node N2. The input terminal of the pull-up circuit 12 is also coupled to the second node N2. The pulse width control circuit 11 is configured to control a potential at the second node based on the potential at the first node under control of the first control signal CK1 and the second control signal CK2, so as to control the pull-up circuit 12 to output the high level signal to the output terminal OUT. Further, the shift register is configured so that the pull-down circuit 13 is controlled by the first node N1 to stop outputting the low level signal when the pull-up circuit 12 is controlled by the second node N2 to output the high level signal.

The first node N1 and the second node N2 are configured to operate in such a way, so that a timing at which the pull-up circuit and the pull-down circuit sequentially output the high level signal or the low level signal to the output terminal OUT is controlled.

In an embodiment, the pulse width control circuit 11 is further configured to, when the pull-up circuit 12 outputs the high level signal to the output terminal OUT, maintain the potential at the second node N2 to be a potential which enables the pull-up circuit 12 to output the high level signal to the output terminal OUT under control of the first control signal CK1 and the second control signal CK2.

Thereby, in this embodiment, the pulse width control circuit 11 is further configured to operate in such a way, so that a duration in which the pull-up circuit is maintained to output the high level signal may be adjusted through the first control signal CK1 and the second control signal CK2, thereby realizing a shift register with an adjustable pulse width.

An exemplary circuit structure of the shift register according to the embodiment of the present disclosure will be described in detail below with reference to FIG. 2. In the following description, the first control signal CK1 and the second control signal CK2 may be clock signals, which are set to be substantially inverted. Further, for the sake of simplicity, the circuit will be described by taking P-type transistors as an example.

The input circuit 10 may comprise a first transistor T1 having a gate coupled to the first control terminal to receive the first control signal CK1, a first electrode coupled to a trigger signal terminal to receive the trigger signal STV, and a second electrode coupled to the first node N1. When the first control signal CK1 is at an active level, for example, a low level in a case of a P-type transistor, the first transistor T1 is turned on. The turn-on of the first transistor T1 causes the potential of the trigger signal STV to be transmitted to the first node N1. For example, if STV is at a high potential, N1 is also at a high potential. The input terminal of the pull-down circuit 13 is also coupled to the first node N1, and whether the pull-down circuit 13 outputs the low level signal may be controlled by a high potential or a low potential at the first node N1.

The pulse width control circuit 11 may comprise a second transistor T2, a third transistor T3, a fourth transistor T4, and a fifth transistor T5. The second transistor T2 has a gate coupled to the first node N1, a first electrode coupled to the second node N2, and a second electrode coupled to a first reference potential terminal, for example, a high potential terminal VGH. The third transistor T3 has a gate coupled to the first control terminal, a first electrode coupled to a second reference potential terminal, for example, a low potential terminal VGL, and a second electrode coupled to a third node N3. The fourth transistor T4 has a gate coupled to the third node N3, a first electrode coupled to the second reference potential terminal, for example, the low potential terminal VGL, and a second electrode coupled to a fourth node N4. The fifth transistor T5 has a gate coupled to the second control terminal, a first electrode coupled to the fourth node N4, and a second electrode coupled to the second node N2.

For the input circuit 10 and the pulse width control circuit 11 having the above structures, in a preliminary phase, when the trigger signal STV jumps to a high potential VGH, and the first control signal CK1 jumps to a low potential VGL, the first transistor T1 is turned on to transmit the high potential of STV to the first node N1. When N1 is at a high potential, the second transistor T2 is turned off. The low potential of CK1 also causes the third transistor T3 to be turned on, and a potential at the third node N3 is pulled down, so that the fourth transistor T4 is turned on to transmit the low potential VGL to the fourth node. At this time, if the second control signal CK2 is at a low potential, the low potential of CK2 causes the fifth transistor T5 to be turned on, to transmit the low potential at the fourth node to the second node N2. In this way, the potential at the second node N2 is pulled down, to control the pull-up circuit 12 to pull up a potential at the output terminal OUT to the high potential VGH.

The pull-down circuit 13 may comprise a seventh transistor T7. A gate of the seventh transistor T7 is coupled to the first node N1, so that turn-on of the seventh transistor T7 is controlled by the potential at the first node N1. A first electrode of the seventh transistor T7 is coupled to the low potential terminal VGL, and a second electrode of the seventh transistor T7 is coupled to the output terminal OUT. Therefore, in a case of a P-type transistor, the seventh transistor T7 is turned on and the second electrode of the seventh transistor T7 outputs a low level signal when the first node N1 is at a low potential; and when the first node N1 is at a high potential, the seventh transistor T7 is turned off, and the pull-down circuit 13 does not output a signal to the output terminal OUT.

The pull-up circuit 12 may comprise an eighth transistor T8. The eighth transistor T8 has a gate coupled to the second node N2, a first electrode coupled to the high potential terminal VGH, and a second electrode coupled to the output terminal OUT.

The pull-up circuit is coupled in such a way, so that whether the pull-up circuit 12 outputs the high level signal may be controlled by the potential at the second node N2. For example, in an example of a P-type transistor, when the second node N2 is at a low potential, the eighth transistor T8 is turned on, and the pull-up circuit 12 outputs the high level signal at the high potential terminal VGH to OUT.

According to an embodiment of the present disclosure, there is provided a shift register with a simpler structure, which enables a smaller layout area of a single stage of GOA, thus facilitating display with a narrow bezel.

Figure 3:
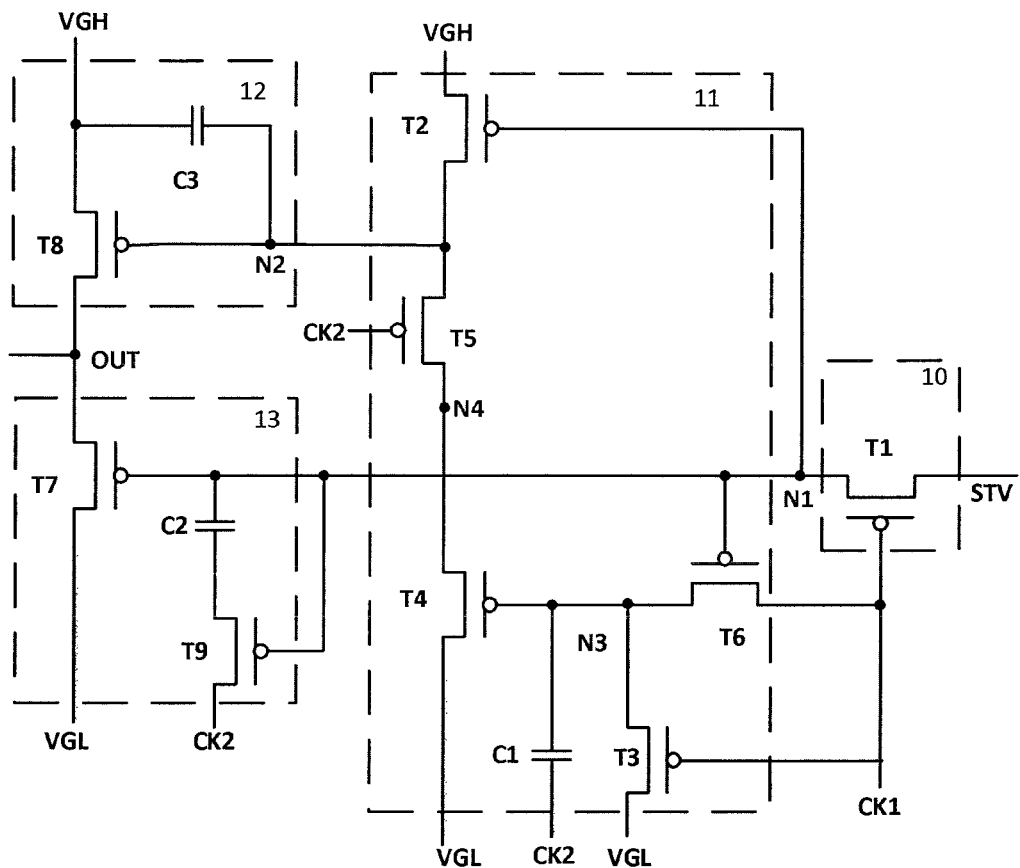
FIG. 3 is a circuit diagram of a shift register according to another embodiment of the present disclosure.

FIG. 3 is a circuit diagram of a shift register according to another embodiment of the present disclosure, wherein except that the pulse width control circuit 11, the pull-up circuit 12, and the pull-down circuit 13 comprise some additional components, remaining elements, signals or nodes referenced by the same numbers are the same as those in FIG. 2.

As shown in FIG. 3, in an embodiment, additionally, the pulse width control circuit 11 may further comprise a sixth transistor T6 and a first capacitor C1. The sixth transistor T6 has a gate coupled to the first node N1, a first electrode coupled to the first control terminal, and a second electrode coupled to the third node N3. The first capacitor C1 has one terminal coupled to the second control terminal CK2, and the other terminal coupled to the third node N3.

Thus, in a case where STV is at a high potential, when the second control signal CK2 jumps to the low potential VGL and the first control signal CK1 jumps to the high potential VGH, since the third transistor T3 has been turned on, the third node N3 is pulled down to a low potential, and therefore a negative potential is stored by the first capacitor C1. Thus, when the second control signal CK2 jumps to a low potential, the third node N3 may be pulled down to a lower potential by the capacitor, so that the fourth transistor T4 may be turned on well, and thereby the low potential at the low potential terminal VGL is transmitted to the fourth node N4, that is, the first electrode of the fifth transistor, without a threshold loss. The low potential of the second control signal CK2 may cause the fifth transistor T5 to be turned on, so that the second node N2 is pulled down. In this phase, the high potential at N1 and the high potential of CK1 cause the third transistor T3 and the sixth transistor T6 to be in a turn-off state, so that the third node N3 is suspended, and thus may jump with the second control signal CK2, to enable the third node N3 to be pulled down better.

In a phase in which the potential at the output terminal OUT is pulled down and outputs a low potential, when CK1 jumps to a high potential and CK2 jumps to a low potential, the first node N1 may jump to a lower potential under action of a capacitor C2. At this time, T6 is still in a turn-on state, to transmit the high potential of CK1 to the third node N3. In this way, T4 may be turned off, to prevent the potential at the second node N2 from being pulled down due to turn-on of a connection between T5 and T4, thereby enabling the output terminal OUT to be maintained well in a state of outputting a low potential.

In an embodiment, additionally, the pull-down circuit 13 may further comprise a ninth transistor T9 and a second capacitor C2. The ninth transistor T9 has a gate coupled to the first node N1, a first electrode coupled to the second control signal CK2, and a second electrode coupled to one terminal of the second capacitor C2. The other terminal of the second capacitor C2 is coupled to the first node N1.

For the pull-down circuit 13 with such a structure, after the first node N1 jumps to the potential, the ninth transistor T9 is turned on, and a negative potential is stored by the second capacitor C2. When the second control signal CK2 jumps to a low potential, the potential at the first node N1 is further pulled down.

In this way, a driving pull-down capability of the seventh transistor T7 is enhanced. The output terminal OUT may even output a low potential without a threshold loss. Further, the ninth transistor T9 is configured so that the low level signal output by the pull-down circuit may not jitter due to the second capacitor C2, thus making the shift register circuit according to the present embodiment more stable.

In an embodiment, additionally, the pull-up circuit 12 may further comprise a third capacitor C3. The third capacitor C3 has one terminal coupled to the high potential terminal VGH, and the other terminal coupled to the gate of the eighth transistor T8. The third capacitor C3 may function to store and maintain a high potential when a high pulse is output.

The shift register according to the embodiment shown in FIG. 3 may comprise transistors T1-T9 and three capacitors C1-C3, and related signals primarily comprise the first clock signal CK1, the second clock signal CK2, the trigger signal STV, the first reference potential signal VGH and the second reference potential signal VGL.

In the shift register according to the embodiment of the present disclosure, the pull-up module may be controlled by the pulse width control module to output the high level signal under control of the first control signal and the second control signal, wherein a pulse width of the high level signal varies with that of the trigger signal. The shift register has a very simple structure, which is beneficial to reduce the layout area of the GOA, thereby achieving a narrow bezel design.

Figure 4:
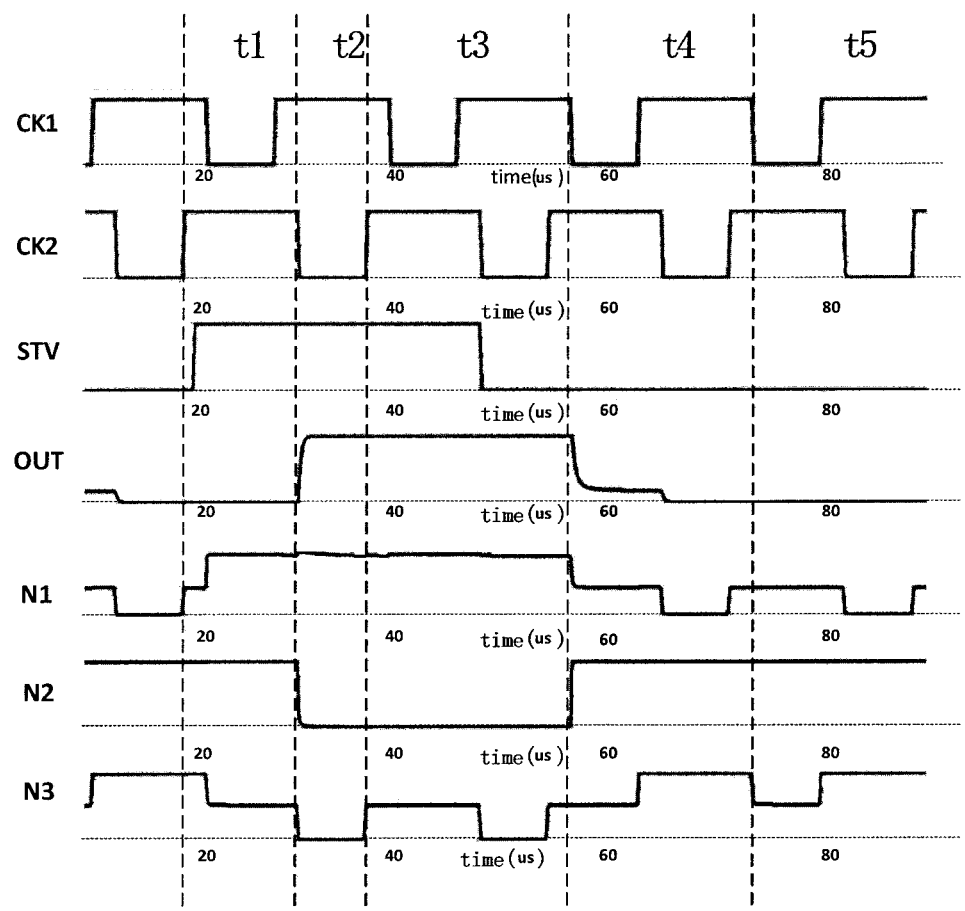
FIG. 4 is a signal timing diagram of a shift register according to an embodiment of the present disclosure.

FIG. 4 is a simulation timing diagram of a shift register according to an embodiment of the present disclosure. For convenience of description, the timing will be described in conjunction with the shift register according to the embodiment of the present disclosure shown in FIG. 3. An operating process of the shift register may comprises five phases t1, t2, t3, t4, and t5. As shown in FIG. 4, an operating principle of the shift register will be described as follows (transistors in this example are all P-type transistors).

In a first phase (a preliminary phase) t1, STV jumps to a high potential VGH, CK1 jumps to a low potential VGL, T1 is turned on to transmit the high potential of the STV signal to the first node N1, and at this time, T2, T6, T7 are turned off. At the same time, the low potential of CK1 causes T3 to be turned on, and a potential at the third node N3 is pulled down.

In a second phase (a pull-up phase) t2, CK1 jumps to the high potential VGH, and CK2 jumps to the low potential VGL. Since T3 is turned on in the phase t1, the third node N3 is pulled to a low potential, and therefore a negative potential is stored by C1. When CK2 jumps to a low potential, the third node N3 may be pulled to a lower potential by a capacitor, and thereby T4 may be well turned on, so that the low potential of VGL may be transferred to the fourth node N4 without a threshold loss. The low potential of CK2 causes T5 to be turned on, and thereby the low potential at N4 causes the second node N2 to be pulled down, and T8 is turned on, so that the output terminal OUT is pulled up to the high potential VGH.

In a third phase (a high-potential maintenance phase) t3, STV is still at a high potential in this phase. In the high potential-to-low potential/low potential-to-high potential jump process of CK1 and CK2, as long as STV and CK1 are not at a low potential at the same time, the operations in the phases t1 and t2 are repeated during the operating process of the circuit.

In a fourth phase (a pull-down phase) t4, STV is at a low potential and CK1 jumps to a low potential. At this time, T1 is turned on, the first node N1 jumps to a low potential, T7 is turned on, and the potential at the output terminal OUT is pulled down. After the first node N1 jumps to a low potential, T9 is turned on, and a negative potential is stored by C2. When CK2 jumps to a low potential, the first node N1 is further pulled down, which enhances a driving pull-down capability of T7. The output terminal OUT outputs a low potential without a threshold loss. Since the output terminal OUT changes to output a low potential under control of CK1 only after STV changes from an active potential to an inactive potential, for example, from a high potential to a low potential, a pulse width of the output terminal OUT varies with that of STV.

In a fifth phase (a low potential maintenance phase) t5, STV is always at a low potential, the operating process of t4 is repeated for CK1 and CK2, and the first node N1 and the second node N2 are maintained at a low potential and a high potential respectively, so that the output terminal OUT is well maintained at a low potential.

The shift register according to the embodiment of the present disclosure at least has the following advantages.

The structure is simple, a number of devices is small, and the control signal is simple.

Further, the output with different pulse widths of the GOA may be well realized by adjusting the pulse width of the trigger signal (i.e., controlling the duration of the active potential maintenance phase t3 of the shift register).

As can be appreciated, in the embodiments of FIGS. 2, 3, and 4, although each transistor is illustrated and described as a P-type transistor, an N-type transistor is also possible. In a case of an N-type transistor, a gate-on voltage is at a high potential, and a gate-off voltage is at a low potential. At this time, compared with a solution using a P-type transistor, two reference potential terminals may be interchanged correspondingly, that is, the first reference potential is a low potential and the second reference potential is a high potential. In various embodiments, the transistors may, for example, be thin film transistors, which are typically manufactured so that their first and second electrodes are used interchangeably. Other embodiments are also contemplated.

As can be appreciated, the term "active potential" as used herein refers to a potential at which a circuit component (for example, a transistor) involved is enabled. For an N-type transistor, the active potential is a high potential. For a P-type transistor, the active potential is a low potential. It will be understood that the active potential or the inactive potential is not intended to refer to a specific potential, but may comprise a range of potentials.

Figure 5:
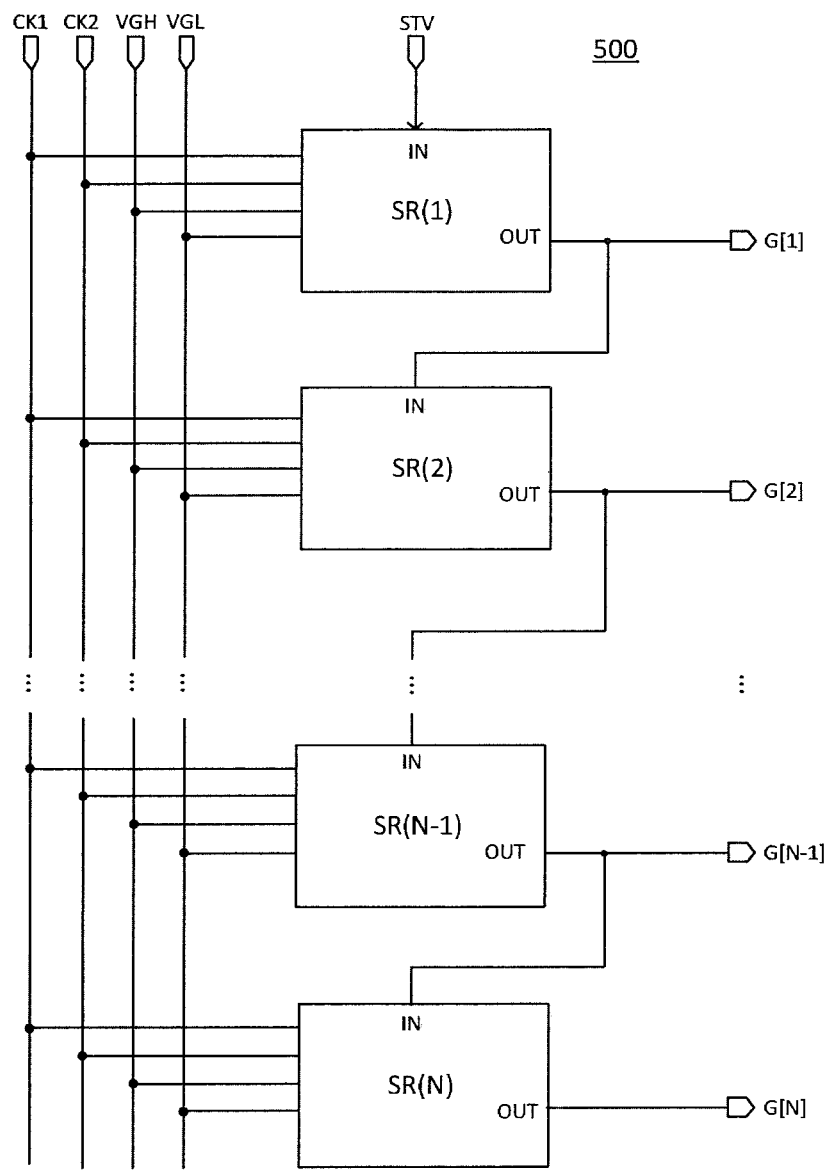
FIG. 5 is a schematic structural diagram of a gate driving circuit according to an embodiment of the present disclosure.

FIG. 5 illustrates a gate driving circuit 500 according to an embodiment of the present disclosure, which comprises N cascaded shift registers SR(1), SR(2), . . . , SR(N−1) and SR(N) according to any of the embodiments described above, where N may be an integer greater than or equal to 2. In the gate driving circuit 500, except for a first shift register circuit SR(1), an input terminal IN of each of the shift register circuits is coupled to an output terminal OUT of an adjacent previous shift register circuit. For example, an input terminal IN of SR(n) is coupled to an output terminal OUT of SR(n−1), where 1<n<=N.

The gate driving circuit according to the embodiment of the present disclosure has an advantage of being simpler in structure and smaller in layout area.

In still another embodiment, there is provided a display apparatus, comprising the gate driving circuit according to the embodiment of the present disclosure.

Therefore, the display apparatus according to the present embodiment has the advantages of the gate driving circuit described above. For example, the GOA has a simple structure, and a small layout area, and thereby may enable a narrow bezel design.

The display apparatus may specifically comprise at least a liquid crystal display apparatus and an organic light emitting diode display apparatus. For example, the display apparatus may be any product or component having a display function such as a liquid crystal display, a liquid crystal television, a digital photo frame, a mobile phone, or a tablet computer etc.

The circuit described herein may be a TFT circuit or a MOS transistor circuit unless otherwise specified. The transistors mentioned herein may all be N-type transistors, in which case a high level signal is an active signal; or may all be P-type transistors, in which case a low level signal is an active signal. In addition, a first electrode of any of the transistors described above is a source, and a second electrode of the transistor is a drain; or the first electrode is a drain, and the second electrode is a source. The transistors described may be manufactured using an amorphous Silicon (a-Si) process, an oxide process, a Low Temperature Poly-Silicon (LTPS) process, a High Temperature Poly-Silicon (HTPS) process, etc.

Various embodiments may be implemented using circuits. Examples of the circuits may comprise circuit elements (for example, transistors, resistors, capacitors, inductors, etc.), integrated circuits, Application Specific Integrated Circuits (ASICs), Programmable Logic Devices (PLDs), Digital Signal Processors (DSPs), Field Programmable Gate Arrays (FPGAs), memory cells, logic gates, registers, semiconductor devices, etc.

It will be understood that, although the terms first, second, third, etc. may be used herein to describe various elements, components and/or parts, these elements, components and/or parts should not be limited by these terms. These terms are only used to distinguish one element, component, or part from another element, component or part. Therefore, a first element, component or part discussed below may be referred to as a second element, component or part without departing from the teachings of the present disclosure.

The terms used herein is for the purpose of describing particular embodiments and is not intended to limit the present disclosure. As used herein, singular forms "a", "an", and "the" are intended to comprise plural forms unless the context clearly indicates otherwise. It will be further understood that the terms "comprise" and/or "contain", when used in the specification, are intended to refer to the presence of the features, integers, steps, operations, elements and/or components, but should not preclude the presence or addition of one or more other features, integers, steps, operations, elements, components, and/or groups thereof. As used herein, the term "and/or" comprises any and all combinations of one or more of associated listed items.

It will be understood that when an element is referred to as "connected to another element" or "coupled to another element", it may be directly connected to the other element or directly coupled to the other element, or there may be an intermediate element therebetween. In contrast, when an element is referred to as "directly connected to another element" or "directly coupled to another element," there is no intermediate element therebetween.

All terms (comprising technical and scientific terms) used here have the same meaning as commonly understood by those of ordinary skill in the art to which the present disclosure belongs, unless otherwise defined. It should also be understood that terms such as those defined in a general dictionary should be understood to have meaning consistent with the meaning in the context of the related art and/or the present specification, and will not be explained as an idealized or excessively formal meaning unless specifically defined as here.

The present disclosure is not limited to the specific embodiments described above, and various changes and variations may be made by those skilled in the art according to the present disclosure without departing from the spirit and essence of the present disclosure, but these corresponding changes and variations should be within the protection scope of the appended claims of the present disclosure.

I claim:

1. A shift register, comprising:
a pull-down circuit;
an input circuit electrically coupled to a first control terminal, and configured to receive a trigger signal, and control a pull-down circuit to output a second level signal to an output terminal based on the trigger signal under control of a first control signal at the first control terminal;

a pull-up circuit; and a pulse width control circuit electrically coupled to the first control terminal and a second control terminal, and configured to control the pull-up circuit to output a first level signal to the output terminal under control of the first control signal and a second control signal CK2 at the second control terminal, wherein a pulse width of the first level signal varies with a pulse width of the trigger signal, wherein the shift register is configured to, when the pull-up circuit is controlled to output the first level signal, the pull-down circuit is controlled to stop outputting the second level signal, and when the pull-down circuit is controlled to output the second level signal, the pull-up circuit is controlled to stop outputting the first level signal;

wherein the pull-down circuit comprises a seventh transistor, a ninth transistor T9 and a second capacitor C2;

wherein the seventh transistor has a gate electrically coupled to the first node, a first electrode electrically coupled to a second reference potential terminal, and a second electrode electrically coupled to the output terminal;

the ninth transistor has a gate electrically coupled to the first node, a first electrode electrically coupled to the second control terminal, and a second electrode electrically coupled to a first terminal of the second capacitor, and a second terminal of the second capacitor is electrically coupled to the first node.

2. The shift register according to claim 1, wherein the input circuit and the pulse width control circuit are electrically coupled to a first node, and the pulse width control circuit and the pull-up circuit are electrically coupled to a second node, wherein the input circuit is further configured to control a potential at the first node based on the trigger signal under control of the first control signal CK1, and the pulse width control circuit is further configured to:

control the pull-up circuit to output the first level signal by controlling a potential at the second node using the potential at the first node under control of the first control signal and the second control signal, and control the pull-down circuit by the potential at the first node to stop outputting the second level signal when the pull-up circuit is controlled by the potential at the second node to output the first level signal.

3. The shift register according to claim 2, wherein the pulse width control circuit is further configured to, when the pull-up circuit outputs the first level signal to the output terminal, maintain the potential at the second node to be a potential which enables the pull-up circuit to output the first level signal to the terminal node under control of the first control signal and the second control signal.

4. The shift register according to claim 2, wherein the input circuit comprises a first transistor T1 having a gate electrically coupled to the first control signal, a first electrode electrically coupled to receive the trigger signal, and a second electrode electrically coupled to the first node.

5. The shift register according to claim 2, wherein the pulse width control circuit comprises a second transistor T2, a third transistor T3, a fourth transistor T4, and a fifth Transistor T5, wherein the second transistor has a gate electrically coupled to the first node, a first electrode electrically coupled to the second node, and a second electrode electrically coupled to a first reference potential terminal, the third transistor has a gate electrically coupled to the first control terminal, and a first electrode electrically coupled to a second reference potential terminal, the fifth transistor has a gate electrically coupled to the second control terminal, a first electrode electrically coupled to a second electrode of the fourth transistor, and a second electrode electrically coupled to the first electrode of the second transistor.

6. The shift register according to claim 5, wherein the pulse width control circuit further comprises a sixth transistor T6 and a first capacitor, wherein the sixth transistor has a gate electrically coupled to the first node, a first electrode electrically coupled to the first control terminal, and a second electrode electrically coupled to the gate of the fourth transistor, and the first capacitor has a first terminal electrically coupled to the second control terminal, and a second terminal coupled to the gate of the fourth transistor.

7. The shift register according to claim 2, wherein the pull-up circuit comprises an eighth transistor T8 having a gate electrically coupled to the second node, a first electrode electrically coupled to a first reference potential terminal, and a second electrode electrically coupled to the output terminal.

8. The shift register according to claim 7, wherein the pull-up circuit further comprises a third capacitor C3 having a first terminal electrically coupled to the first reference potential terminal, and a second terminal electrically coupled to the gate of the eighth transistor.

9. A gate driving circuit comprising the shift register according to claim 1.

10. A display device comprising the gate driving circuit according to claim 9.

11. The shift register according to claim 5, wherein the first reference potential and the second reference potential are opposite in phase with each other.

* * * * *